(12) United States Patent
Choi et al.

(10) Patent No.: US 7,616,048 B2
(45) Date of Patent: Nov. 10, 2009

(54) BODY BIASING CONTROL CIRCUIT USING LOOKUP TABLE AND BODY BIASING CONTROL METHOD USING SAME

(75) Inventors: Byunghee Choi, Busan (KR); Jun Seomun, Seoul (KR); Jung-yun Choi, Hwaseong-si (KR); Hyo-sig Won, Suwon-si (KR); Youngsoo Shin, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/849,486

(22) Filed: Sep. 4, 2007

(65) Prior Publication Data

US 2008/0054989 A1    Mar. 6, 2008

(30) Foreign Application Priority Data

Sep. 5, 2006  (KR) .................. 10-2006-0085301

(51) Int. Cl.
*H03K 3/01* (2006.01)
(52) U.S. Cl. ....................... 327/534; 327/537
(58) Field of Classification Search .......... 327/534–537
See application file for complete search history.

(56) References Cited

U.S. PATENT DOCUMENTS

| 3,457,435 | A | * | 7/1969 | Gibson et al. ................ 327/437 |
| 5,023,688 | A | * | 6/1991 | Ando et al. .................. 257/350 |
| 6,429,726 | B1 | * | 8/2002 | Bruneau et al. ............. 327/537 |
| 6,466,077 | B1 | * | 10/2002 | Miyazaki et al. ............ 327/534 |
| 6,518,825 | B2 | * | 2/2003 | Miyazaki et al. ............ 327/534 |
| 6,574,161 | B2 | * | 6/2003 | Ooishi ........................ 365/182 |
| 6,774,705 | B2 | * | 8/2004 | Miyazaki et al. ............ 327/534 |
| 6,847,252 | B1 | * | 1/2005 | Ono et al. .................... 327/537 |
| 7,106,128 | B2 | * | 9/2006 | Tschanz et al. ............. 327/534 |
| 7,262,631 | B2 | * | 8/2007 | Chong ......................... 326/33 |
| 2002/0079951 | A1 | | 6/2002 | Borkar et al. |
| 2004/0021501 | A1 | | 2/2004 | Das et al. |
| 2004/0123170 | A1 | | 6/2004 | Tschanz et al. |
| 2006/0055449 | A1 | * | 3/2006 | Uratani et al. .............. 327/534 |
| 2006/0066388 | A1 | | 3/2006 | Tschanz et al. |
| 2006/0132218 | A1 | * | 6/2006 | Tschanz et al. ............. 327/534 |
| 2007/0205824 | A1 | * | 9/2007 | Perisetty ...................... 327/536 |

FOREIGN PATENT DOCUMENTS

WO    2004061633  A2    7/2004

* cited by examiner

*Primary Examiner*—Lincoln Donovan
*Assistant Examiner*—Thomas J Hiltunen
(74) *Attorney, Agent, or Firm*—Volentine & Whitt, PLLC

(57) ABSTRACT

A body biasing control circuit capable of being shared by a plurality of macro blocks and can independently control body voltages of a plurality of macro blocks. The body biasing control circuit includes a lookup table for storing a plurality of indexes where each index is associated with a body voltage appropriate for an operating state of a corresponding macro block. A control unit receives a corresponding index from the lookup table and generates a plurality of body voltages appropriate for an operating state of a macro block corresponding to the index and supplies the body voltages to the macro block.

10 Claims, 6 Drawing Sheets

FIG. 5

| VB | DECODER OUTPUT | NBODY | PBODY |
|---|---|---|---|
| 000 | 10000000 | 0.4 | 1.4 |
| 001 | 01000000 | 0.2 | 1.6 |
| 010 | 00100000 | 0.1 | 1.7 |
| 011 | 00010000 | 0.0 | 1.8 |
| 100 | 00001000 | -0.1 | 1.9 |
| 101 | 00000100 | -0.2 | 2.0 |
| 110 | 00000010 | -0.4 | 2.2 |
| 111 | 00000001 | -1.5 | 3.3 |

ACTIVE MODE (VB(A)): 000–110

STANDBY MODE (VB(S)): 111

BODY BIASING CONTROL CIRCUIT USING LOOKUP TABLE AND BODY BIASING CONTROL METHOD USING SAME

BACKGROUND OF THE INVENTION

1. Field of the Invention

The present invention relates to a CMOS digital circuit having a body biasing control circuit to compensate for non-uniformity and changes in threshold voltages caused by defects in semiconductor manufacturing processes. In addition, the present invention also relates to the reduction of leakage current generated in the body biasing control circuit during operation.

This U.S. non-provisional patent application claims priority under 35, U.S.C § 119, of Korean Patent Application No. 10-2006-0085301, filed on Sep. 5, 2006, in the Korean Intellectual Property Office, the disclosure of which is incorporated herein in its entirety by reference.

2. Description of the Related Art

In the field of digital circuit technology, recent research is focused on integrating many functions in a single chip and achieving high performance while minimizing power consumption. In order to reduce power consumption, operating voltages must be lowered. However, the reduction of operating voltages causes two problems. First, when an operating voltage is reduced, the threshold voltage must also be reduced in order to compensate for decreased circuit speed. This reduction of the threshold voltage significantly increases the leakage current. The leakage current continuously flows even when the circuit does not operate. This leakage current is particularly problematic in circuits having a standby period longer than an operating period such as those used in mobile phones, PDAs, etc.

Another problem arises when the speed is lowered due to nonuniformity and changes in threshold voltages caused by faulty semiconductor manufacturing processes. A threshold voltage depends, in part, on semiconductor manufacturing processes. The lower an operating voltage, the greater the change in threshold voltage has on circuit speed. That is, when a change in threshold voltage is generated, the speed of a circuit changes within an allowable range at a high operating voltage, but the speed of the circuit can deviate from the allowable range at a low operating voltage. This significantly reduces semiconductor manufacturing yield resulting in increased manufacturing costs.

In order to resolve these problems, an adaptive body biasing method has been developed. An exemplary adaptive body biasing method is disclosed in U.S. Patent Application Publication No. 2006/0066388.

FIG. 1 illustrates a PMOS transistor used in a CMOS circuit, and FIG. 2 illustrates a NMOS transistor used in a CMOS circuit. The PMOS transistor and the NMOS transistor each include a gate G, a drain D, a source S, and a body terminal B. In a conventional CMOS circuit, a body terminal B of an NMOS transistor is connected to a ground and a body terminal B of a PMOS transistor is connected to a terminal with a predetermined voltage such as a supply voltage. When a different voltage is applied to the body terminal B, a threshold voltage of the NMOS or PMOS transistor changes. If a reverse bias voltage is applied between the body terminal B and the source terminal S, a threshold voltage increases which causes the speed of the CMOS circuit to decrease thereby reducing the leakage current. If a forward bias voltage is applied between the body terminal B and the source terminal S, the threshold voltage decreases which causes the speed of the CMOS circuit to decrease and the leakage current to be reduced. The adaptive body biasing method arguably resolves the leakage current problem and the threshold voltage non-uniformity problem generated in the semiconductor manufacturing process using the above-described characteristics. By applying a forward bias voltage between a body terminal B and a source terminal S in circuits having a high threshold voltage, it is possible to reduce a threshold voltage and obtain a desired circuit speed. By applying a reverse bias voltage in circuits having a low threshold voltage, it's possible to reduce a leakage current while maintaining an appropriate circuit speed. By applying a very high reverse bias current when the circuits are not in operation, it is possible to prevent leakage current flow.

FIG. 3 is a block diagram of a conventional adaptive body biasing circuit including a monitoring circuit 31, a bias generator 33, and a target circuit 35. Monitoring circuit 31 checks a threshold voltage of target circuit 35. If the threshold voltage of the target circuit 35 is lower than a desired threshold voltage, the bias generator 33 changes the body voltage (VBODY) of target circuit 35 which slightly increases the threshold voltage. If the threshold voltage of the target circuit 35 is higher than the desired threshold voltage, bias generator 33 changes the body voltage VBODY of the target circuit 35 which slightly decreases the threshold voltage. By repeatedly performing this operation, a desired threshold voltage of the target circuit 35 can be obtained.

However, drawbacks associated with such a conventional adaptive body bias circuit described above include a need for increased semiconductor area because monitoring circuit 31 and bias generator 33 occupy a large area; increased power consumption by the biasing circuit; and the time required for biasing is relatively long. Accordingly, the conventional adaptive body biasing circuit may be used in a large-sized CMOS circuit, but cannot be used independently in small macro blocks in a semiconductor chip. Also, in order to independently bias several macro blocks, monitoring circuits and bias generators corresponding to the number of macro blocks are required which greatly increases circuit overhead.

Accordingly, there is a need for a body biasing control circuit having a relatively small size when implemented as an integrated circuit and a body biasing circuit capable of being shared by a plurality of macro blocks and which can independently control body voltages of a plurality of macro blocks.

SUMMARY OF THE INVENTION

The present invention provides a body biasing control circuit having a lookup table for storing a plurality of indexes where each index indicates a body voltage appropriate for an operating state of a corresponding macro block. A control unit communicates with the lookup table, receives the plurality of indexes and generates a plurality of body voltages appropriate for an operating state of a macro block corresponding to at least one of the plurality of indexes and provides the body voltages to the macro block. The present invention also provides a body biasing control method which can independently control body voltages of a plurality of macro blocks.

BRIEF DESCRIPTION OF THE DRAWINGS

FIG. 5 is a table showing exemplary body voltages which are generated by a control circuit according to indexes;

DETAILED DESCRIPTION OF THE INVENTION

Figure 1:
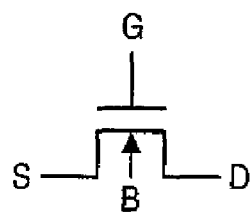
FIG. 1 illustrates a PMOS transistor used in a CMOS circuit.
Figure 2:
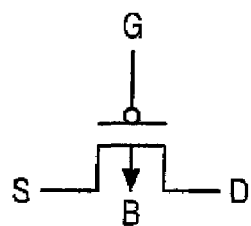
FIG. 2 illustrates a NMOS transistor used in a CMOS circuit.
Figure 3:
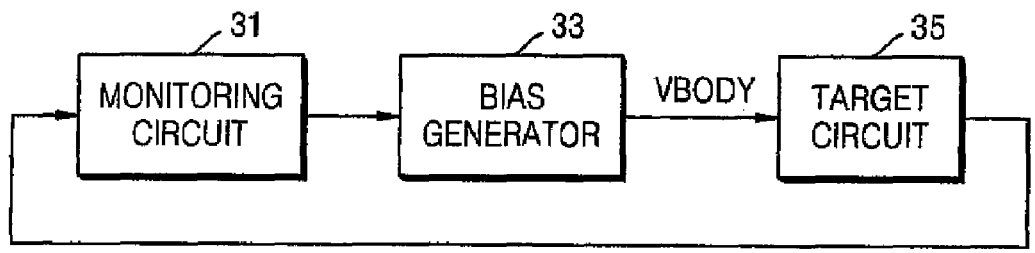
FIG. 3 is a block diagram of a conventional adaptive body biasing circuit.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 4:
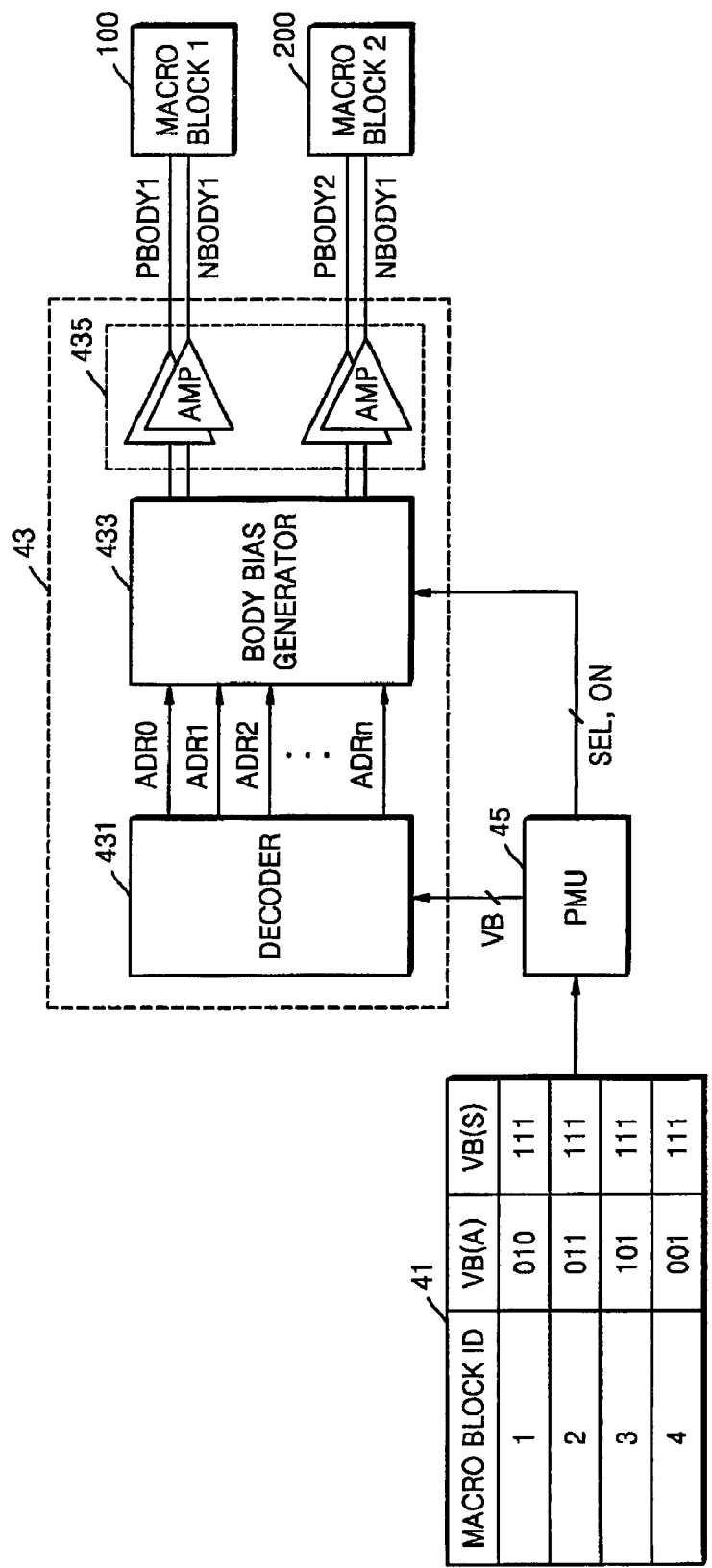
FIG. 4 is a block diagram of a body biasing control circuit according to an embodiment of the present invention.

FIG. 4 is a block diagram of a body biasing control circuit 10 according to an embodiment of the present invention which includes a lookup table 41, a control unit 43, and a power management unit 45. Lookup table 41 records indexes which represent body voltages corresponding to operating states of macro block 100 and macro block 200. In particular, indexes VB(A) represent body voltages when macro block 100 and macro block 200 are in an active state and indexes VB(S) represent body voltages when macro block 100 and macro block 200 are in a standby state. Power management unit 45 reads the indexes VB corresponding to the operating states of macro blocks 100 and 200 from lookup table 41 and provides the indexes VB to control unit 43. Power management unit 45 also generates an enable signal ON and a macro block selection signal SEL for controlling control unit 43. Control unit 43 receives the corresponding indexes VB and generates body voltages PBODY and NBODY corresponding to the operating states of macro blocks 100 and 200 and supplies these voltages to the corresponding macro blocks. The body voltage PBODY is applied to PMOS transistors associated with the respective macro blocks 100 and 200 and the body voltage NBODY is applied to NMOS transistors of the respective macro blocks 100 and 200. Although FIG. 4 illustrates two (2) macro blocks 100 and 200 controlled by control unit 43, more macro blocks may be controlled by the same control unit 43 if necessary. Control unit 43 includes a decoder 431, a body bias generator 433, and an amplifier 435. Decoder 431 decodes an index VB received from power management unit 45 and supplies output bits ADR0-ADRn to body bias generator 433. In response to output bits ADR0-ADRn, body bias generator 433 generates body voltages suitable for the operating states of the respective macro blocks 100 and 200. Amplifier 435 receives and amplifies the voltages and supplies body voltages PBODY and NBODY to the corresponding macro blocks 100 and 200.

FIG. 5 is a table showing exemplary body voltages generated by control unit 43 according to indexes VB. Indexes VB(000)-VB(110) are associated with index VB(A) representing body voltages when macro blocks 100 and 200 are in an active state. Indexes VB(111) is an index VB(S) representing a body voltage when macro blocks 100 and 200 are in a standby state. The body voltages NBODY that are to be applied to the NMOS transistors and body voltages PBODY that are to be applied to the PMOS transistors correspond in pairs to each index VB. The number of bits of each index VB determines the accuracy of body biasing. That is, as the number of bits of each index increases, the body voltages NBODY and PBODY are more precisely controlled, but the body biasing control circuit becomes more complex. The indexes VB are determined after chip manufacture. By measuring an operating speed while changing index values in a unit of each macro block, selection of an index associated with a desired operating speed may be obtained.

In operation, power management unit 45 reads an index VB (for example, "000") of a macro block that is to be controlled from lookup table 41. Decoder 431 decodes the index VB(000) and the output bits ADR0-ADRn of decoder 431 become "10000000". Accordingly, a body voltage NBODY of 0.4V and a body voltage PBODY of 1.4V are generated by body bias generator 433 and amplifier 435. These voltages are supplied from amplifier 435 to macro block 100 or 200 in accordance with the logic states of the enable signal ON and the macro block selection signal SEL. For example, if the enable signal ON is a logic "1" and the macro block selection signal SEL is a logic "0", body voltage NBODY (0.4, V) and body voltage PBODY (1.4, V) are supplied to macro block 100. If the enable signal ON is a logic "1" and the macro block selection signal SEL is a logic "1", body voltage NBODY (0.4V) and the body voltage PBODY (1.4V) are supplied to macro block 200.

Figure 6:
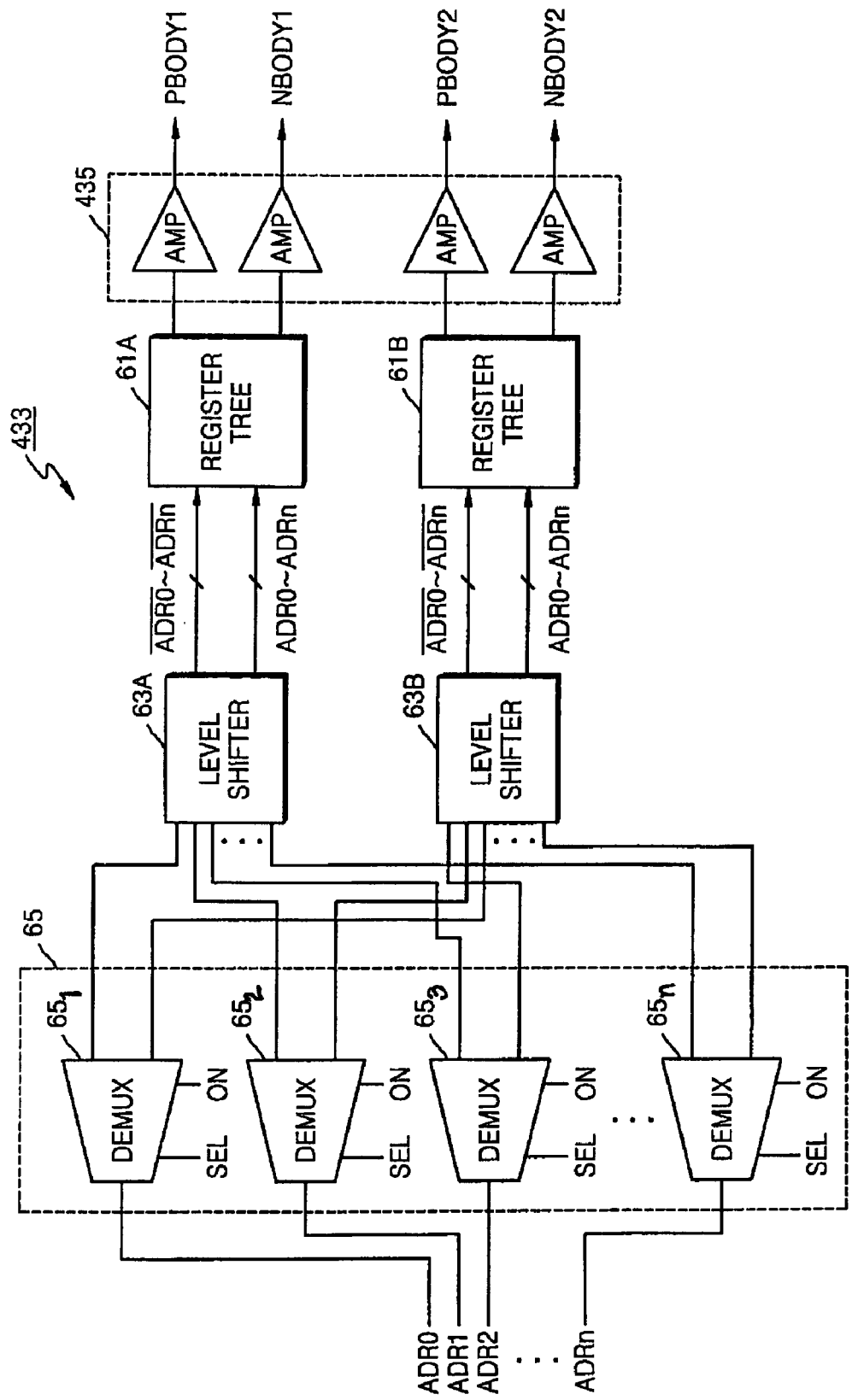
FIG. 6 is a block diagram of a body bias generator illustrated in FIG. 4.
Figure 7:
FIG. 7 illustrates waveform diagrams of an enable signal and a macro block selection signal.

FIG. 6 is a block diagram of the body bias generator 433 illustrated in FIG. 4. Body bias generator 433 includes a plurality of register trees 61A and 61B, a plurality of level shifters 63A and 63B and a selection circuit 65. The register tree 61A and the level shifter 63A are associated with macro block 100 and register tree 61B and level shifter 63B are associated with macro block 200. In response to the enable signal ON and the macro block selection signal SEL, selection circuit 65 demultiplexes the output bits ADR0-ADRn of decoder 431 and outputs the results to level shifter 63A or 63B. The selection circuit 65 includes a plurality of demultiplexers $65_1$-$65_n$, for demultiplexing the respective output bits ADR0-ADRn. Demultiplexers $65_1$-$65_n$, are controlled by the enable signal ON and the macro block selection signal SEL. FIG. 7 illustrates exemplary waveform diagrams of the enable signal ON and the macro block selection signal SEL.

Figure 8:
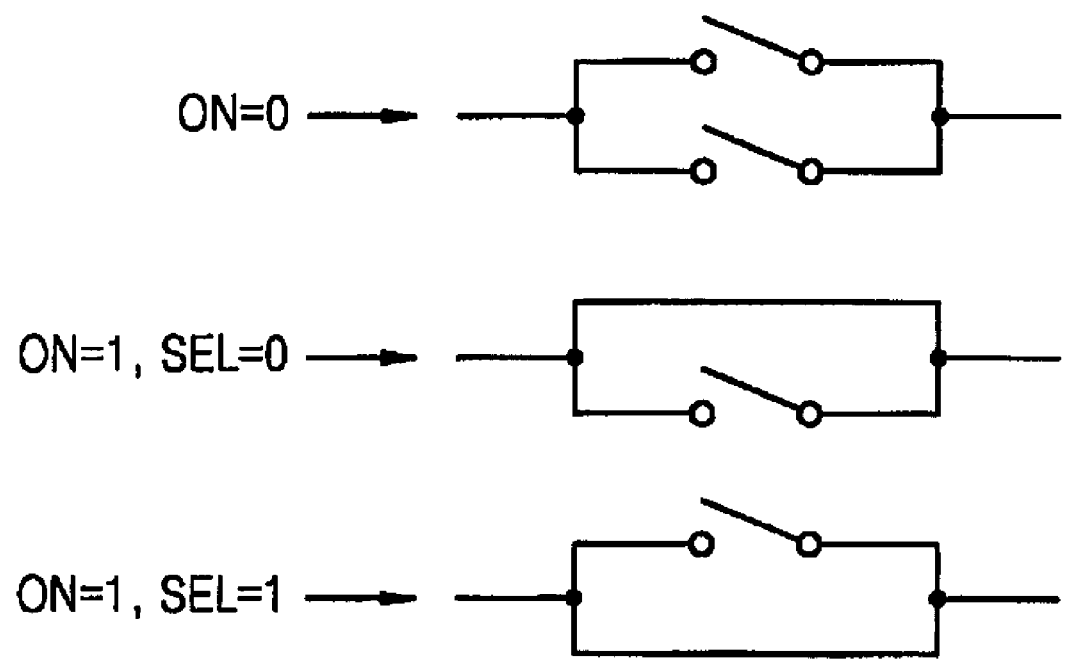
FIG. 8 illustrates switching configurations of demultiplexers, according to the logic states of the enable signal and the macro block selection signal.

FIG. 8 illustrates switching configurations of demultiplexers $65_1$-$65_n$, according to logic states of the enable signal ON and the macro block selection signal SEL. If the enable signal ON becomes a logic "0", demultiplexers $65_1$-$65_n$, are turned off and output bits ADR0-ADRn of decoder 431 are not supplied to level shifters 63A and 63B. If the enable signal ON is a logic "1" and the macro block selection signal SEL is a logic "0", the output bits ADR0-ADRn of decoder 431 are output to level shifter 63A. If the enable signal ON is a logic "1" and the macro block selection signal SEL is a logic "1", the output bits ADR0-ADRn of decoder 431 are output to level shifter 63B.

Figure 9:
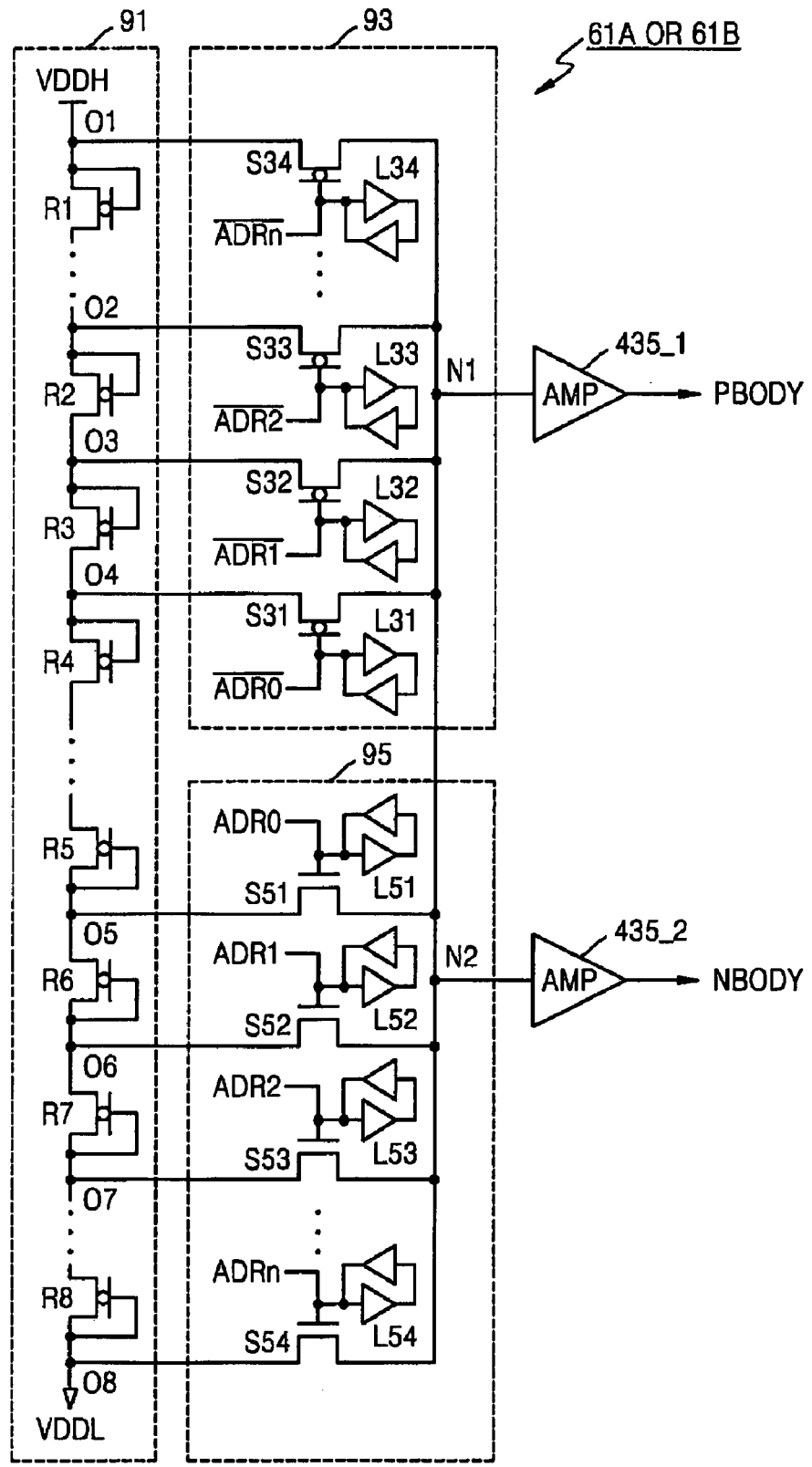
FIG. 9 is a circuit diagram of register trees illustrated in FIG. 6.

Referring back to FIG. 6, level shifters 63A and 63B convert voltage levels of output bits ADR0-ADRn to voltage levels which can control switches S31-S34 and S51-S54 illustrated in FIG. 9 associated with the corresponding register trees 61A and 61B, and outputs the converted voltage levels of output bits /ADR0-/ADRn. Level shifters 63A and 63B are also configured to supply output bits ADR0-ADRn. The voltage levels of the output bits ADR0-ADRn are converted using level shifters 63A and 63B because the voltage levels for controlling switches S31-S34 consisting of PMOS transistors are different from the voltage levels used for controlling switches S51-S54 consisting of NMOS transistors.

Register tree 61A generates body voltages suitable for the operating state of the corresponding macro block 100 in response to the output bits ADR0-ADRn and the converted output bits /ADR0-/ADRn. The body voltages generated by register tree 61A are amplified by amplifier 435 such that final body voltages PBODY1 and NBODY1 are supplied to macro block 100. Similarly, register tree 61B generates body voltages suitable for the operating state of the corresponding macro block 200 in response to the output bits ADR0-ADRn and the converted output bits /ADR0-/ADRn. The body voltages generated by register tree 61B are amplified by amplifier 435 such that final body voltages PBODY2 and PBODY2 are supplied to macro block 200. Body voltages PBODY1 represent body voltages to be applied to the PMOS transistors of macro block 100 and body voltages NBODY1 represent body voltages to be applied to NMOS transistors of macro block 100. Body voltages PBODY2 represent body voltages to be applied to PMOS transistors of macro block 200 and body voltages NBODY2 represent body voltages to be applied to NMOS transistors of macro block 200.

FIG. 9 is a circuit diagram of register trees 61A and 61B illustrated in FIG. 6. Each register tree 61A and 61B includes a voltage divider 91, a first switch circuit 93, and a second switch circuit 95. Voltage divider 91 is connected between a first reference voltage VDDH and a second reference voltage VDDL and divides a voltage range between the first reference voltage VDDH and the second reference voltage VDDL into a plurality of output voltages O1-O8. The first switch circuit 93 selects one voltage from among output voltages O1-O4 of voltage divider 91. This selected output voltage is supplied as body voltage PBODY to the PMOS transistors of the corresponding macro block (for example, macro block 100 or 200 illustrated in FIG. 4) via amplifier 435-1 in response to the converted output bits /ADR0 through /ADRn. Second switch circuit 95 selects one voltage from among the output voltages O5-O8 of voltage divider 91. This selected output voltage is supplied as a body voltage NBODY to the NMOS transistors of the corresponding macro block via amplifier 435-2 in response to output bits ADR0-ADRn. By appropriately configuring voltage divider 91, first switch circuit 93, and second switch circuit 95, body voltages PBODY and NBODY are generated having the exemplary values illustrated in FIG. 4 corresponding to output bits ADR0-ADRn of decoder 431. Voltage divider 91 includes a plurality of resistors R1-R8 which are connected in series between first reference voltage VDDH and second reference voltage VDDL. Resistors R1-R8 may be, for example, PMOS transistors.

First switch circuit 93 includes a plurality of PMOS switches S31-S34 connected between output nodes O1-O4 of voltage divider 91. Switch circuit 93 also includes first common node N1 where the converted output bits /ADR0-/ADRn are applied to the gates of PMOS switches S31-S34 and a plurality of first latch circuits L31-L34 which are connected to the gates of the PMOS switches S31-S34. Second switch circuit 95 includes a plurality of NMOS switches S51-S54 connected between output nodes O5-O8 of voltage divider 91. Circuit 95 also includes second common node N2 where the output bits ADR0-ADRn are applied to the gates of NMOS transistors S51-S54 and a plurality of second latch circuits L51-L54 connected to the gates of the NMOS switches S51-S54. The latch circuits L31-L34 and L51-L54 are connected to the gates of switches S31-S34 and S51-S54 so that the body voltages PBODY and NBODY of a macro block (for example, macro block 200) are maintained when a different macro block (for example, macro block 100) is controlled.

The body biasing control circuit in accordance with the present invention does not require a conventional monitoring circuit for checking a threshold voltage and can be implemented as a small-sized integration circuit. In addition, the body biasing control circuit can be shared by a plurality of macro blocks and can independently control body voltages associated with the plurality of macro blocks. Since body voltages appropriate for the operating state of each macro block are directly generated according to indexes; the time required for biasing can be reduced as compared with conventional techniques.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A body biasing control circuit for controlling a plurality of body voltages associated with a plurality of macro blocks, comprising:
    a lookup table storing a plurality of indexes, each index indicating a body voltage appropriate for an operating state of a corresponding macro block; and
    a control unit receiving said plurality of indexes from said lookup table and generating a plurality of body voltages appropriate for an operating state of a macro block corresponding to at least one of said plurality of indexes, and providing the body voltages to said macro block,
    wherein the control unit further comprises:
        a decoder configured to decode the plurality of indexes and outputting corresponding bits;
        a body bias generator communicating with said decoder and configured to generate a body voltage appropriate for an operating state of the corresponding macro block in response to said decoder output bits
    wherein the body bias generator comprises:
        a selection circuit having a plurality of demultiplexers receiving said corresponding bits from said decoder and outputting a plurality of output bits in response to an enable signal and a macro block selection signal;
        a plurality of level shifters receiving the plurality of output bits from said demultiplexers of said selection unit and converting a plurality of voltage levels associated with said output bits; and
        a plurality of register trees, communicating with said level shifters and receiving said converted output bits, and generating a body voltage of the corresponding macro block in response to said output bits and the converted output bits; and
    an amplifier disposed between said body bias generator and said macro block, said amplifier amplifying the body voltage and supplying the amplified body voltage to said corresponding macro block, and
    the indexes stored in said lookup table represent a plurality of body voltages when each macro block is in an active state and a plurality of body voltages when each macro block is in a standby state.

2. The body biasing control circuit of claim 1, wherein each level shifter converts the voltage levels of the output bits of the decoder to a plurality of voltage levels suitable for controlling a plurality of switches in a corresponding register tree.

3. The body biasing control circuit of claim 1, wherein each register tree comprises:
- a voltage divider connected between a first reference voltage and a second reference voltage, said voltage divider configured to divide a difference between said first reference voltage and said second reference voltage into a plurality of output voltages;
- a first switch unit disposed between said voltage divider and said amplifier, said first switch unit selecting one from among the output voltages of said voltage divider and supplying the selected output voltage as a first body voltage to PMOS transistors associated with a corresponding macro block, in response to said converted output bits; and
- a second switch unit disposed between said voltage divider and said amplifier, said second switch unit selecting another one from among the output voltages of said voltage divider and supplying the selected output voltage as a second body voltage to NMOS transistors associated with a corresponding macro block, in response to said output bits.

4. A body biasing control circuit for controlling a plurality of body voltages associated with a plurality of macro blocks, comprising:
- a lookup table storing a plurality of indexes, each index indicating a body voltage appropriate for an operating state of a corresponding macro block; and
- a control unit receiving said plurality of indexes from said lookup table, generating a plurality of body voltages appropriate for an operating state of a macro block corresponding to at least one of said plurality of indexes, and providing the body voltages to said macro block, wherein the control unit comprises:
- a decoder configured to decode the plurality of indexes and outputting corresponding bits;
- a body bias generator communicating with said decoder and configured to generate a body voltage appropriate for an operating state of the corresponding macro block in response to said decoder output bits, wherein the body bias generator comprises:
- a selection circuit having a plurality of demultiplexers receiving said corresponding bits from said decoder and outputting a plurality of output bits in response to an enable signal and a macro block selection signal;
- a plurality of level shifters receiving the plurality of output bits from said demultiplexers of said selection unit and converting a plurality of voltage levels associated with said output bits; and
- a plurality of register trees, communicating with said level shifters and receiving said converted output bits, and generating a body voltage of the corresponding macro block in response to said output bits and the converted output bits; and an amplifier disposed between said body bias generator and said macro block, said amplifier amplifying the body voltage and supplying the amplified body voltage to said corresponding macro block.

5. The body biasing control circuit of claim 4, wherein each level shifter converts the voltage levels of the output bits of the decoder to a plurality of voltage levels suitable for controlling a plurality of switches in a corresponding register tree.

6. The body biasing control circuit of claim 5, wherein each register tree comprises:
- a voltage divider connected between a first reference voltage and a second reference voltage, said voltage divider configured to divide a difference between said first reference voltage and said second reference voltage into a plurality of output voltages;
- a first switch unit disposed between said voltage divider and said amplifier, said first switch unit selecting one from among the output voltages of said voltage divider and supplying the selected output voltage as a first body voltage to PMOS transistors associated with a corresponding macro block, in response to said converted output bits; and
- a second switch unit disposed between said voltage divider and said amplifier, said second switch unit selecting another one from among the output voltages of said voltage divider and supplying the selected output voltage as a second body voltage to NMOS transistors associated with a corresponding macro block, in response to said output bits.

7. The body biasing control circuit of claim 6, wherein said voltage divider comprises a plurality of resistors connected in series between said first reference voltage and said second reference voltage.

8. The body biasing control circuit of claim 7, wherein said resistors are PMOS transistors.

9. The body biasing control circuit of claim 6, wherein said voltage divider includes a plurality of output nodes connected to said first switch unit and said second switch unit, said first switch unit further comprising:
- a first common node;
- a plurality of PMOS transistors connected between at least one of said plurality of output nodes of said voltage divider and said first common node and a plurality of gates to which said converted output bits are supplied; and
- a plurality of first latch units connected to the gates of said PMOS transistors.

10. The body biasing control circuit of claim 9, wherein the second switch unit comprises:
- a second common node;
- a plurality of NMOS transistors connected between the at least one of said plurality of output nodes not connected to said PMOS transistors and said second common node and having gates to which the output bits are supplied; and
- a plurality of second latch units connected to the gates of said NMOS transistors.

* * * * *